(12) United States Patent
Dyer

(10) Patent No.: US 7,488,659 B2
(45) Date of Patent: Feb. 10, 2009

(54) STRUCTURE AND METHODS FOR STRESS CONCENTRATING SPACER

(75) Inventor: Thomas W. Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 11/692,371

(22) Filed: Mar. 28, 2007

(65) Prior Publication Data

US 2008/0237726 A1    Oct. 2, 2008

(51) Int. Cl.
*H01L 21/336* (2006.01)
(52) U.S. Cl. .................. 438/296; 438/294; 438/938
(58) Field of Classification Search .................. 438/50, 438/184, 303, 938, 294, 296
See application file for complete search history.

(56) References Cited

U.S. PATENT DOCUMENTS 6,621,131 B2 * 9/2003 Murthy et al. .............. 257/408

2005/0247986 A1 * 11/2005 Ko et al. .................... 257/411
2006/0189053 A1 * 8/2006 Wang et al. ................ 438/197

* cited by examiner

*Primary Examiner*—Alexander G Ghyka
*Assistant Examiner*—Leonard Chang
(74) *Attorney, Agent, or Firm*—Scully, Scott, Murphy & Presser, P.C.; H. Daniel Schnurmann

(57) ABSTRACT

A stress-concentrating spacer structure is a stack of an upper gate spacer with a low Young's modulus and a lower gate spacer with a high Young's modulus. The stacked spacer structure surrounds the gate electrode. The stress-concentrating spacer structure may contact an inner gate spacer that contacts the gate electrode or may directly contact the gate electrode. The upper gate spacer deforms substantially more than the lower gate spacer. The stress generated by the stress liner is thus transmitted primarily through the lower gate spacer to the gate electrode and subsequently to the channel of the MOSFET. The efficiency of the transmission of the stress from the stress liner to the channel is thus enhanced compared to conventional MOSFETs structure with a vertically uniform composition within a spacer.

1 Claim, 13 Drawing Sheets

STRUCTURE AND METHODS FOR STRESS CONCENTRATING SPACER

FIELD OF THE INVENTION

The present invention relates to semiconductor structures with stress, and particularly to semiconductor structures that concentrate liner stress on a channel of a metal-oxide-semiconductor field effect transistor (MOSFET) and methods of manufacturing the same.

BACKGROUND OF THE INVENTION

A key metric for performance of transistors is the on-current, which is the current of a transistor per unit gate width when it is turned on. The on-current may be altered by changes in the band structure of the semiconductor substrate on which the transistor is formed. While the nature of stress needed to increase the on-current of a transistor may be dependent on the semiconductor substrate and the type of the transistor, in general, the band structure of a semiconductor device may be altered to increase the mobility of charge carriers, i.e., electrons or holes. For example, by manipulating transistor structures such that a favorable type of stress is applied to each type of transistors, both P-type field effect transistors (PFETs) and N-type field effect transistors (NFETs) with enhanced minority carrier mobility may be formed in a CMOS transistor device.

Particularly, the electron mobility and the on-current are increased on an NFET formed on a silicon substrate if the channel of NFET is under a tensile uniaxial stress in the direction of the current flow in the channel. Likewise, the hole mobility and the on-current are increased for a PFET formed on a silicon substrate if the channel of PFET is under a compressive uniaxial stress in the direction of the current flow in the channel. Structures, known in the art, for applying stress to the channel of a field effect transistor include a strained semiconductor substrate, stress liners, and stress-generating embedded source and drain semiconductor materials.

According to the prior, stress applied to the channel of a MOSFET is generated by a stress liner surrounding a gate electrode. The stress liner is of unitary construction around the gate electrode and surrounds the gate spacer, which surrounds the gate electrode. Typically, the stress liner contacts the entire outer sidewalls of the gate spacer and applies either a compressive stress or a tensile stress to the gate spacer. The stress applied to the gate spacer is transmitted to the gate electrode and to the channel of the MOSFET. In general, the higher the stress, the greater the modification to the band structure and the change to the mobility. Stress liners are typically silicon nitrides formed by plasma enhanced chemical vapor deposition (PECVD) or high density plasma chemical vapor deposition (HDPCVD). Stress liners that can apply a high compressive or tensile stress of 2~3 GPa in magnitude to the channel of the MOSFET are known in the art.

The stress generated by the stress liners is typically distributed over the gate electrode and the channel. Since the band structure of the channel is entirely determined by the stress of the channel, but is independent of the stress on the gate electrode, the stress applied to the gate electrode does not enhance the mobility of the charge carriers. The level of stress that a particular type of stress liner can generate is limited by intrinsic properties of the stress liner. Yet, an even higher level of stress on the channel is desired to enhance the mobility of charge carriers in the channel.

Therefore, there exists a need to increase the stress on the channel of a MOSFET through more effective use of the stress generated by stress liners.

Specifically, there exists a need for a semiconductor structure that more effectively transmits the stress that is generated by a stress liner to the channel of the MOSFET and methods of manufacturing the same.

SUMMARY OF THE INVENTION

The present invention addresses the needs described above by providing a metal-oxide-semiconductor field effect transistor (MOSFET) structure in which the stress generated by a liner is more effectively concentrated to the channel of the MOSFET compared to conventional MOSFETs.

Particularly, the present invention provides a MOSFET structure with a stress-concentrating spacer structure that surrounds a gate electrode. The stress-concentrating spacer structure is a stack of an upper gate spacer with a low Young's modulus and a lower gate spacer with a high Young's modulus. In other words, the upper gate spacer is more elastic than the lower gate spacer. The stress-concentrating spacer structure may contact an inner gate spacer that contacts the gate electrode or may directly contact the gate electrode. The upper gate spacer deforms substantially more than the lower gate spacer under stress. The stress generated by the stress liner is thus transmitted primarily through the lower gate spacer to the gate electrode and subsequently to the channel of the MOSFET. Compared with conventional MOSFET structures with a vertically uniform composition within a spacer, the efficiency of the transmission of the stress from the stress liner to the channel is thus enhanced by employing a material with a high Young's modulus at the bottom and another material with a low Young's modulus at the top of the stress-concentrating spacer structure.

According to an aspect of the present invention, a metal-oxide-semiconductor field effect transistor (MOSFET) structure is provided, which comprises:

a gate electrode contacting a gate dielectric on a semiconductor substrate;

a channel located directly beneath the gate dielectric and located in the semiconductor substrate;

an inner gate spacer directly contacting the gate electrode;

a lower gate spacer having a first Young's modulus and contacting the inner gate spacer;

an upper gate spacer having a second Young's modulus and contacting the inner gate spacer and a top surface of the lower gate spacer, wherein the first Young's modulus is greater than the second Young's modulus; and a stress liner directly contacting the lower gate spacer, wherein the stress liner applies stress to the lower gate spacer and to the channel.

According to another aspect of the present invention, a metal-oxide-semiconductor field effect transistor (MOSFET) structure is provided, which comprises:

a gate electrode contacting a gate dielectric on a semiconductor substrate;

a channel located directly beneath the gate dielectric and located in the semiconductor substrate;

a lower gate spacer having a first Young's modulus and directly contacting the gate electrode;

an upper gate spacer having a second Young's modulus and directly contacting the gate electrode and a top surface of the lower gate spacer, wherein the first Young's modulus is greater than the second Young's modulus; and a stress liner directly contacting the lower gate spacer, wherein the stress liner applies stress to the lower gate spacer and to the channel.

According to both aspects of the present invention, the stress liner may directly contact the upper gate spacer and a top surface of the gate electrode. Alternatively, the stress liner may contain a hole with a periphery, wherein the stress nitride liner is located outside the periphery and terminates on the periphery, and the periphery of the hole is substantially coincident with an outer edge of the lower gate spacer. A gate cap liner may, or may not, be located directly on top of the gate electrode. In embodiments wherein a gate cap liner is present, the gate cap liner does not contact the lower gate spacer and is disjoined from the stress liner.

The MOSFET structures may further comprise a source and drain metal semiconductor alloy located directly on source and drain regions, wherein the inner gate spacer is L-shaped and directly contacts the source and drain metal semiconductor alloy and a bottom surface of the lower gate spacer. Alternatively, the lower gate spacer directly may contact source and drain regions of the MOSFET.

The MOSFET structures may further comprise another stress liner, wherein the another stress liner applies the opposite type of stress to an underlying semiconductor structure than the stress liner.

In one embodiment of the present invention, the first Young's modulus may be in the range from about 40 GPa to about 1,000 GPa and the second Young's modulus may be in the range from 0 GPa to about 40 GPa. The lower gate spacer may comprise a material selected from the group consisting of silicon carbide, aluminum oxide, silicon nitride, magnesium oxide, zirconium oxide, wet oxidation silicon oxide, dry oxidation silicon oxide, borophosphosilicate glass, borosilicate glass, phosphosilicate glass, fluorosilicate glass, and undoped silicate glass, and the upper gate spacer may comprise a material selected from the group consisting of polyarylene, organosilicate glass (OSG), and polyimide.

In another embodiment of the present invention, the first Young's modulus may be in the range from about 100 GPa to about 1,000 GPa and the second Young's modulus may be in the range from 0 GPa to about 100 GPa. The lower gate spacer may comprise a material selected from the group consisting of silicon carbide, aluminum oxide, silicon nitride, magnesium oxide, zirconium oxide, and the upper gate spacer may comprise a material selected from the group consisting of wet oxidation silicon oxide, dry oxidation silicon oxide, borophosphosilicate glass, borosilicate glass, phosphosilicate glass, fluorosilicate glass, and undoped silicate glass.

According to yet another aspect of the present invention, a method of manufacturing a semiconductor structure is provided, which comprises:

forming a gate electrode on a gate dielectric on a semiconductor substrate;

forming a source and drain metal semiconductor alloy on the semiconductor substrate;

forming a non-conformal lower spacer layer with a first Young's modulus on the gate electrode and the semiconductor substrate;

removing a vertical portion of the non-conformal lower spacer layer on the gate electrode and exposing underlying vertical surfaces, whereby a substrate-contacting lower spacer layer is formed directly on the source and drain metal semiconductor alloy and a gate-top-contacting lower spacer layer is formed directly on the gate electrode from remaining portions of the non-conformal lower spacer layer;

forming an upper gate spacer with a second Young's modulus directly on the exposed underlying vertical surfaces and on the substrate-contacting lower spacer layer, wherein the first Young's modulus is greater than the second Young's modulus; and removing the gate-top-contacting lower spacer layer and a portion of the substrate-contacting lower spacer layer that is not covered by the upper gate spacer to form a lower gate spacer directly beneath the upper gate spacer.

The method may further comprise forming an L-shaped inner gate spacer that directly contacts sidewalls of the gate electrode and source and drain regions, wherein the exposed underlying vertical surfaces are sidewalls of the L-shaped inner gate spacer, and the lower gate spacer is formed directly on the L-shaped inner gate spacer and is disjoined from the source and drain region. Alternatively, an inner gate spacer may be formed directly on sidewalls of the gate electrode and the lower gate spacer may be formed directly on the source and drain regions. In another alternative, the lower gate spacer may be formed directly on the sidewalls of the gate electrode and the source and drain regions.

The method may further comprise forming a stress liner directly on the lower gate spacer and the upper gate spacer.

The method may further comprise forming a middle-of-line (MOL) dielectric layer on the stress liner, wherein the MOL dielectric layer is disjoined from the lower gate spacer, the upper gate spacer, and the gate electrode.

The method may further comprise:

removing a portion of the stress liner from above the sidewalls of the upper gate spacer; and forming a middle-of-line (MOL) dielectric layer on a remaining portion of the stress liner, wherein the remaining portion is located directly on a source and drain metal semiconductor alloy and the MOL dielectric layer directly contacts the upper gate spacer.

The method may further comprise removing the stress liner from above the gate electrode, wherein the MOL dielectric layer directly contacts a top surface of the gate electrode.

DETAILED DESCRIPTION OF THE INVENTION

Figure 1:
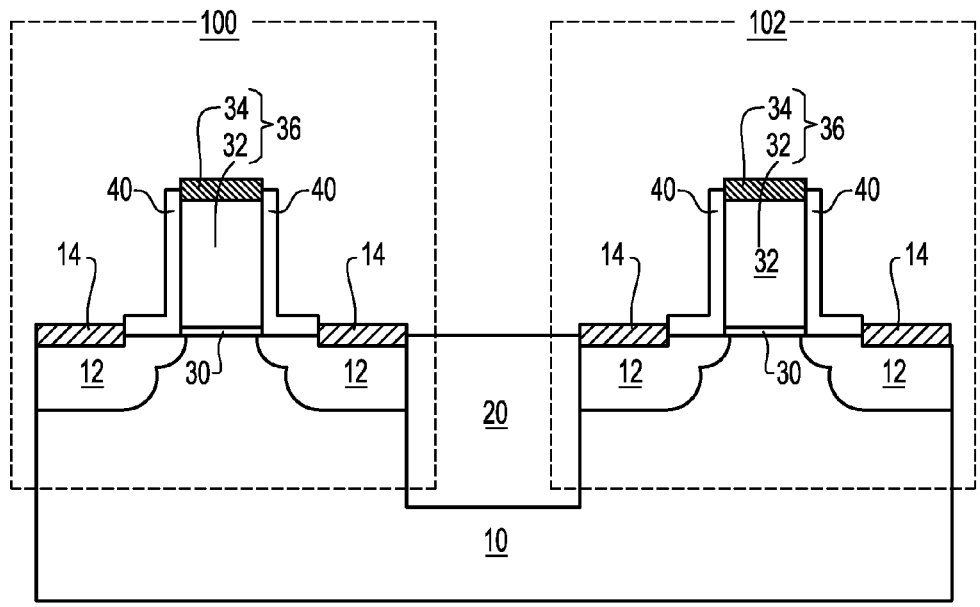
FIGS. 1-8 show sequential vertical cross-sectional views of a first exemplary semiconductor structure according to the present invention.

As stated above, the present invention relates to semiconductor structures that concentrate liner stress on a channel of a metal-oxide-semiconductor field effect transistor (MOSFET) and methods of manufacturing the same, which are now described in detail with accompanying figures. It is noted that like and corresponding elements are referred to by like reference numerals.

Referring to FIG. 1, a first exemplary structure according to the first embodiment is shown. The first exemplary structure comprises a p-type field effect transistor (PFET) 100 and an n-type field effect transistor (NFET) 102, each of which comprises a gate dielectric 30 formed on a semiconductor substrate 10, a gate semiconductor 32, a gate metal semiconductor alloy 34, an L-shaped inner gate spacer 40, source and drain regions 12 formed within the semiconductor substrate 10, and a source and drain metal semiconductor alloy 14 formed on the source and drain regions 12. The PFET 100 and the NFET 102 are separated by shallow trench isolation 20 that is formed within the semiconductor substrate 10. The gate semiconductor 32 and the gate metal semiconductor alloy 34 collectively comprise a gate electrode 36.

The L-shaped inner gate spacer 40 is an inner gate spacer, i.e., a type of spacer that directly contacts the sidewalls of the gate electrode 36. The L-shaped inner gate spacer 40 comprises a dielectric material, for example silicon oxide, silicon oxynitride, or silicon nitride. Preferably, the L-shaped inner gate spacer 40 comprises silicon oxide. The L-shaped inner gate spacer 40 may be replaced with other types of inner gate spacers, or even eliminated in the practice of the present invention. The exemplary inner gate spacers, including the L-shaped inner gate spacer 40 according to the first embodiment, does not limit the application of the present invention to the exemplary structures in any way, but serves as a demonstration of the practicability of the present invention. Various configurations of inners spacers that directly contact the gate electrode 36 are within the knowledge of one of ordinary skill in the art, and are herein explicitly contemplated. The thickness of inner spacers, including the thickness of the L-shaped spacers according to the first embodiment, as measured horizontally from a sidewall of a gate electrode 36, is typically in the range from about 5 nm to about 30 nm, and preferably in the range from about 10 nm to about 20 nm.

The semiconductor substrate 10 comprises a semiconductor material such as silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor substrate 10 may be a bulk substrate, a silicon-on-insulator (SOI) substrate, or a hybrid substrate. The semiconductor substrate 10 may have built-in strain induced by differences in lattice parameters within the substrate.

Both the gate metal semiconductor alloy 34 and the source and drain metal semiconductor alloy 14 are formed by metallization of a semiconductor material, which is well known in the prior art. The metal semiconductor alloys (34, 14) are derived from a metal, such as Ta, Ti, W, Co, Ni, Pt, other refractory metals, and an alloy thereof, by a metallization reaction with the semiconductor material of the semiconductor substrate 10 or of the gate semiconductor 32. If the semiconductor material from which the metal semiconductor alloys (34, 14) are derived is silicon, the metal semiconductor alloy is a metal silicide.

Figure 2:
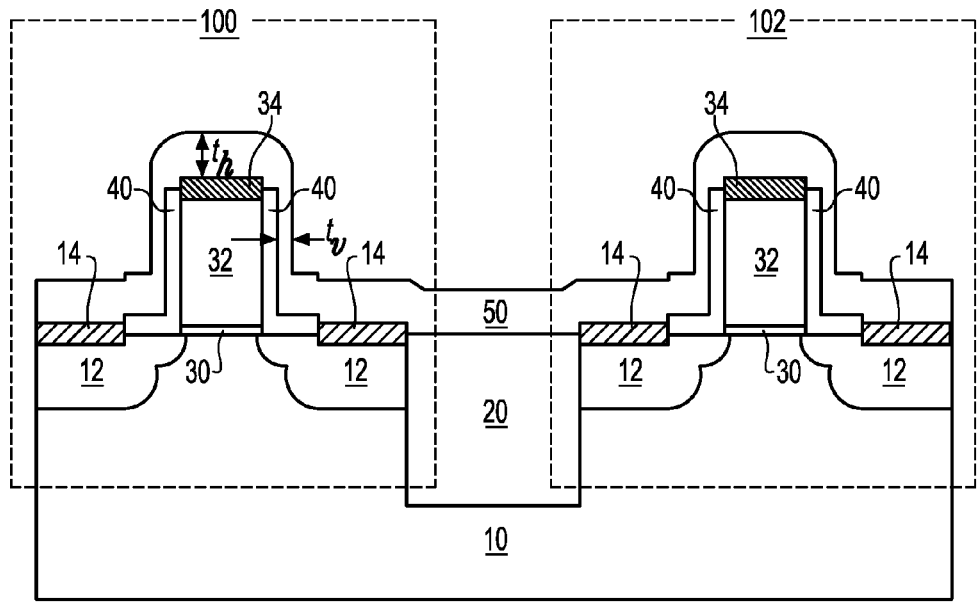

Referring to FIG. 2, a non-conformal lower spacer layer 50 is deposited on the gate electrode 36 and the semiconductor substrate 10. The non-conformal lower spacer layer 50 has a first Young's modulus. The non-conformal lower spacer layer 50 is non-conformal, i.e., the vertical thickness $t_v$, as defined by the thickness of the non-conformal lower spacer layer 50 on a vertical surface, such as sidewalls of the gate electrode 36, is less than the horizontal thickness $t_h$, as defined by the thickness of the non-conformal lower spacer layer 50 on a horizontal surface, such as a top surface of the gate electrode 36. The step coverage, as defined by the ratio of the vertical thickness $t_v$ to the horizontal thickness $t_h$, is in the range between 0 and 1, and is preferably in the range from 0 to about 0.8, and more preferably in the range from 0 to about 0.6.

The horizontal thickness, $t_h$, of the non-conformal lower spacer layer 50 may be in the range from about 10 nm to about 100 nm, and preferably in the range from about 30 nm to about 70 nm.

Stress, σ, on an elastic solid is defined as the force applied per unit area, and in general, is a second-order tensor with 9 components. The 9 components are for each combination of the three orthogonal directions of the surface normal for the area and for three orthogonal components of the force. Strain, ∈, is the ratio of the change in a dimension of the elastic solid to its original value, and in general, is another second order tensor with 9 components. The 9 components are for each combination of the change along each of the orthogonal axes of the elastic solid and for each of the orthogonal axes of the original dimensions.

For small values of an applied stress tensor during elastic deformation, the magnitude of the strain tensor of an elastic solid is linearly proportional to the magnitude of the stress tensor applied on it. The ratio of the stress to strain in the linear elastic region is known as Young's modulus tensor, E, which is also known as the elastic modulus tensor. The stress tensor, σ, the Young's modulus tensor, E, and the strain tensor, ∈, satisfy the following relationship: σ=E·∈. In general, the Young's modulus tensor, E, is a fourth order tensor with 81 components, which can be reduced to 21 independent components for any elastic material by considering symmetry and constraints on strain energy. If the material is isotropic, the 81 components of Young's modulus tensor, E, may further be reduced to the diagonal components that have the same value, E, and some non-diagonal components with the value of the ratio of Young's modulus to Poisson's ratio υ, i.e., E/υ. Young's modulus, E, as the diagonal components of the fourth order Young's modulus tensor is commonly referred to, is a measure of the stiffness of a material, i.e., the higher the Young's modulus of a material, the stiffer it is, and the less strain it exhibits for a given stress.

Table 1 below shows Young's modulus for non-limiting examples of semiconductor, ceramic, and glass materials that may be employed to form the non-conformal lower spacer layer 50 according to the present invention.

TABLE 1

Young's modulus of selected materials that may be employed in a non-conformal lower spacer layer

| material | Young's modulus (GPa) |
|---|---|
| Diamond (C) | 1,000 |
| Tungsten Carbide (WC) | 450-650 |
| Silicon Carbide (SiC) | 450 |
| Aluminum Oxide ($Al_2O_3$) | 390 |
| Berylium Oxide (BeO) | 380 |
| Silicon nitride ($Si_3N_4$) | 210-380 |
| Magnesium Oxide (MgO) | 250 |
| Zirconium Oxide (ZrO) | 160-241 |
| Silicon (Si) | 150 |
| Mullite ($Al_6Si_2O_{13}$) | 145 |
| Wet oxidation silicon oxide ($SiO_2$; formed by | 70 |

TABLE 1-continued

Young's modulus of selected materials that may be employed in a non-conformal lower spacer layer

| material | Young's modulus (GPa) |
|---|---|
| wet oxidation of Si, i.e., Si + 2H$_2$O → SiO$_2$ + 2H$_2$ at 800° C.~1,100° C.) | |
| Dry oxidation Silicon oxide (SiO$_2$; formed by dry oxidation of Si, i.e., Si + O$_2$ → SiO$_2$ at 800° C.~1,100° C.) | 57 |

According to the present invention, the non-conformal lower spacer layer 50 comprises a material with a first Young's modulus, which has a higher value than a second Young's modulus of an upper gate spacer to be subsequently formed. Non-limiting examples of materials that may be used for the non-conformal lower spacer layer 50 include the materials listed in Table 1 as well as borophosphosilicate glass (BPSG), borosilicate glass (BSG), phosphosilicate glass (PSG), fluorosilicate glass (FSG), and undoped silicate glass (USG). The various silicate glasses have values of Young's modulus in the range from about 40 GPa to about 100 GPa.

Methods of forming of the non-conformal lower spacer layer 50 include plasma enhanced chemical vapor deposition (PECVD), high density plasma chemical vapor deposition (HDPCVD), sub-atmospheric chemical vapor deposition (SACVD), high vacuum thermal evaporation, and physical vapor deposition (PVD, i.e., sputtering). While dielectric materials are preferred for the non-conformal lower spacer layer 50, low conductivity semiconductor materials, such as undoped silicon or undoped germanium, may be employed if a dielectric inner gate spacer, such as an L-shaped inner gate spacer 40 according to the first embodiment, is employed to insulate the non-conformal lower spacer layer 50 from the gate electrode 36 and the source and drain regions 12.

Figure 3:
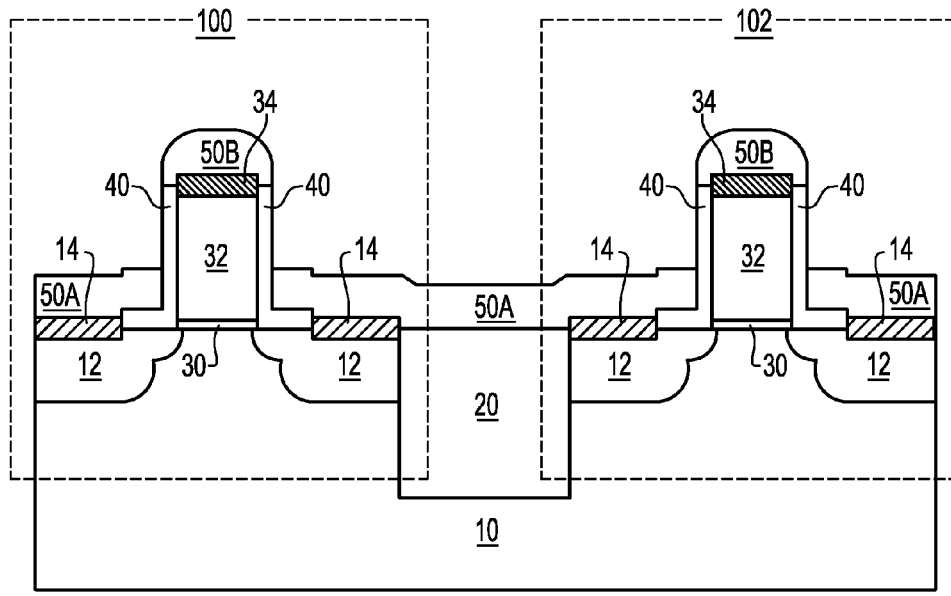

Referring to FIG. 3, a vertical portion of the non-conformal lower spacer layer 50 on the gate electrode 36 is removed, preferably by an isotropic etch. Underlying vertical surfaces, which are sidewalls of the L-shaped inner gate spacer 40 according to the first embodiment, are exposed. The removal of the vertical portion divides the remaining non-conformal lower spacer layer 50 into two portions: a substrate-contacting lower spacer layer 50A which is located directly on a source and drain metal semiconductor alloy 14 and a gate-top-contacting lower spacer layer 50B which is located directly on the gate electrode 36. The substrate-contacting lower spacer layer 50A contacts the source and drain regions 12 and the L-shaped inner gate spacers 40 of the PFET 100 and the NFET 102. The substrate-contacting lower spacer layer 50A has a hole for each unitary gate electrode 36, i.e., for each gate electrode 36 that does not adjoin another gate electrode 36. The substrate-contacting lower spacer layer 50A is not present inside each hole. The edge of each hole is substantially coincident with the exposed sidewalls of the L-shaped inner gate spacer 40. The gate-top-contacting lower spacer layer 50B contacts a top surface of the gate electrodes 36, i.e., the top surface of the gate metal semiconductor alloy 34.

Figure 4:
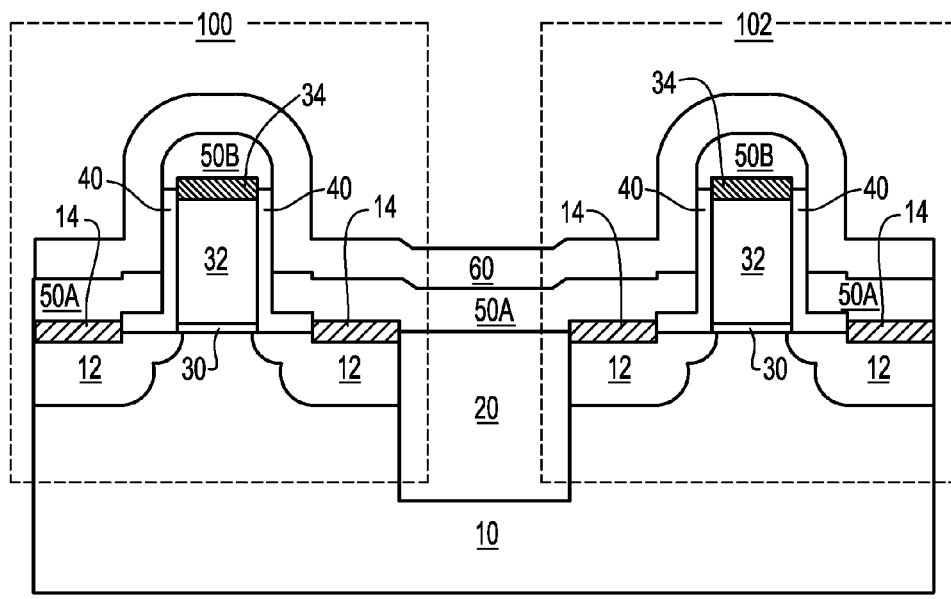

Referring to FIG. 4, an upper spacer layer 60 is formed over the substrate-contacting lower spacer layer 50A, the gate-top-contacting lower spacer layer 50B, and the exposed underlying vertical surfaces, which are the sidewalls of the L-shaped inner gate spacer 40 according to the first embodiment. The upper spacer layer 60 may be conformal or non-conformal, i.e., the step coverage may or may not be equal to 1.0. The upper spacer layer 60 comprises a material with a second Young's modulus, which has a lower value than the first Young's modulus of the non-conformal lower spacer layer 50.

The vertical thickness of the upper spacer layer 60, as measured from a sidewall of the L-shaped inner gate spacer 40, may be in the range from about 20 nm to about 120 nm, and preferably in the range from about 30 nm to about 80 nm.

Table 2 below shows Young's modulus for non-limiting examples of semiconductor, glass, and polymer materials that may be employed to form the upper spacer layer 60 according to the present invention.

TABLE 2

Young's modulus of selected materials that may be employed in an upper spacer layer

| material | Young's modulus (GPa) |
|---|---|
| Silicon oxide (SiO$_2$) formed by wet oxidation | 70 |
| Silicon oxide (SiO$_2$) formed by dry oxidation | 57 |
| SiLK ® (Silicon Low-K; polyarylene) | 11 |
| organosilicate glass (OSG; also called SiCOH, or carbon-doped oxide) | ~10 |
| Polyimide | 3-5 |

The second Young's modulus is greater than the first Young's modulus. Therefore, the range of second Young's modulus depends on the values of the first Young's modulus. Particularly, the second Young's modulus is in the range from 0 GPa to the values of the first Young's modulus. In one variation of the first embodiment and other embodiments to be subsequently described, the second Young's modulus may be in the range from 0 GPa to about 40 GPa if the first Young's modulus is in the range from 40 GPa to about 1,000 GPa. In another variation of the first embodiment and other embodiments to be subsequently described, the second Young's modulus may be in the range from about 0 GPa to about 100 GPa if the first Young's modulus is in the range from about 100 GPa to about 1,000 GPa. Non-limiting examples of materials that may be used for the upper spacer layer 60 include the materials listed in Table 2 as well as borophosphosilicate glass (BPSG), borosilicate glass (BSG), phosphosilicate glass (PSG), fluorosilicate glass (FSG), and undoped silicate glass (USG). The various silicate glasses have a Young's modulus in the range from about 40 GPa to about 100 GPa.

Methods of forming the upper spacer layer 60 include plasma enhanced chemical vapor deposition (PECVD), high density plasma chemical vapor deposition (HDPCVD), sub-atmospheric chemical vapor deposition (SACVD), high vacuum thermal evaporation, physical vapor deposition (PVD, i.e., sputtering), low pressure chemical vapor deposition (LPCVD), and atomic layer deposition (ALD). While dielectric materials are preferred for the upper spacer layer 60, low conductivity semiconductor materials, such as undoped silicon or undoped germanium, may be employed if a dielectric inner gate spacer, such as an L-shaped inner gate spacer 40 according to the first embodiment, is employed to insulate the upper spacer layer 60 from the gate electrode 36 and the source and drain regions 12.

In an exemplary combination, the first Young's modulus may be in the range from about 40 GPa to about 1,000 GPa and the second Young's modulus may be in the range from 0 GPa to about 40 GPa. The lower spacer layer 50 may comprise a material selected from the group consisting of silicon carbide, aluminum oxide, silicon nitride, magnesium oxide, zirconium oxide, wet oxidation silicon oxide, dry oxidation silicon oxide, borophosphosilicate glass (BPSG), borosilicate glass, phosphosilicate glass (PSG), fluorosilicate glass (FSG), and undoped silicate glass (USG), and the upper spacer layer 60 may comprise a material selected from the group consisting of polyarylene, organosilicate glass (OSG), and polyimide. Particularly, the combination of a lower spacer layer 50 comprising a silicon nitride, e.g., a PECVD nitride or HDPCVD nitride, or a silicon oxide, and an upper spacer layer 60 comprising OSG may be readily practiced employing standard semiconductor processing steps.

In another exemplary combination, the first Young's modulus may be in the range from about 100 GPa to about 1,000 GPa and the second Young's modulus may be in the range from 0 GPa to about 100 GPa. The lower spacer layer 50 may comprise a material selected from the group consisting of silicon carbide, aluminum oxide, silicon nitride, magnesium oxide, zirconium oxide, and the upper spacer layer 60 may comprise a material selected from the group consisting of wet oxidation silicon oxide, dry oxidation silicon oxide, borophosphosilicate glass (BPSG), borosilicate glass (BSG), phosphosilicate glass (PSG), fluorosilicate glass (FSG), and undoped silicate glass (USG). Particularly, the combination of a lower spacer layer 50 comprising a silicon nitride, e.g., a PECVD nitride or HDPCVD nitride, and an upper spacer layer 60 comprising a silicon oxide may be readily practiced employing standard semiconductor processing steps.

Figure 5:
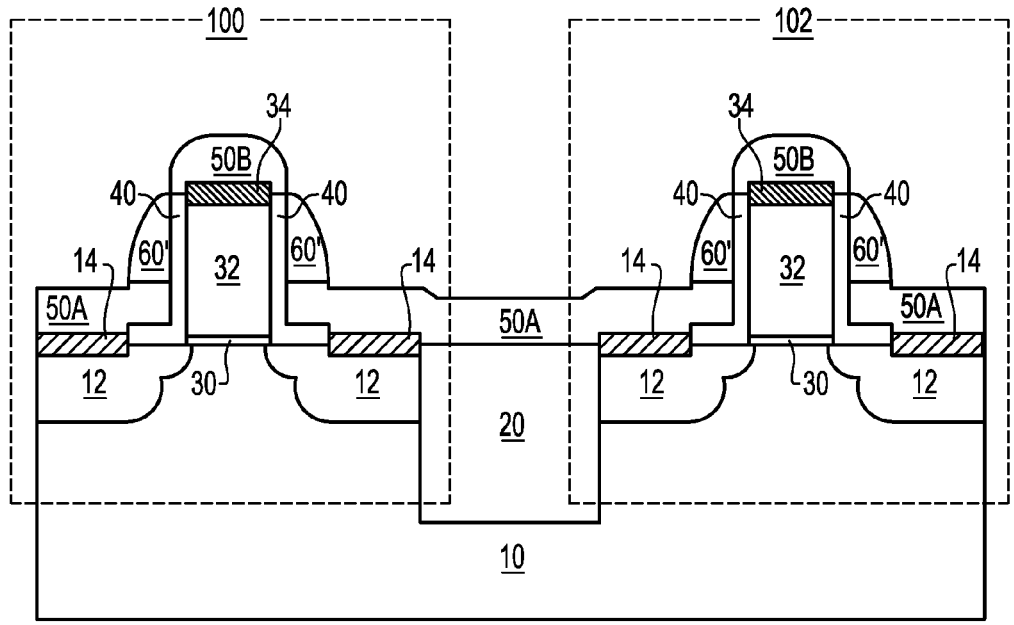

Referring to FIG. 5, an upper gate spacer 60' is formed from the upper spacer layer 60 by a first anisotropic etch, which is preferably a first reactive ion etch (RIE). The methods of forming a spacer out of a film are well known in the art. For each gate electrode 36 separated from another gate electrode 36 by a distance greater than twice the sum of the thickness of the upper spacer layer 60 and the thickness of the L-shaped inner gate spacer 40, an upper gate spacer 60' is formed directly on the L-shaped inner gate spacer 40 and the substrate-contacting lower spacer layer 50A, wherein the upper gate spacer 60' is topologically homeomorphic to a torus, i.e., the upper gate spacer 60' may be transformed into a torus by continuous stretching and bending. Both the substrate contacting lower spacer layer 50A and the gate-top-contacting lower spacer layer 50B are exposed by the first anisotropic etch. The width of the upper gate spacer 60' is substantially the same as the thickness of the upper spacer layer 60 at the time of deposition.

Figure 6:
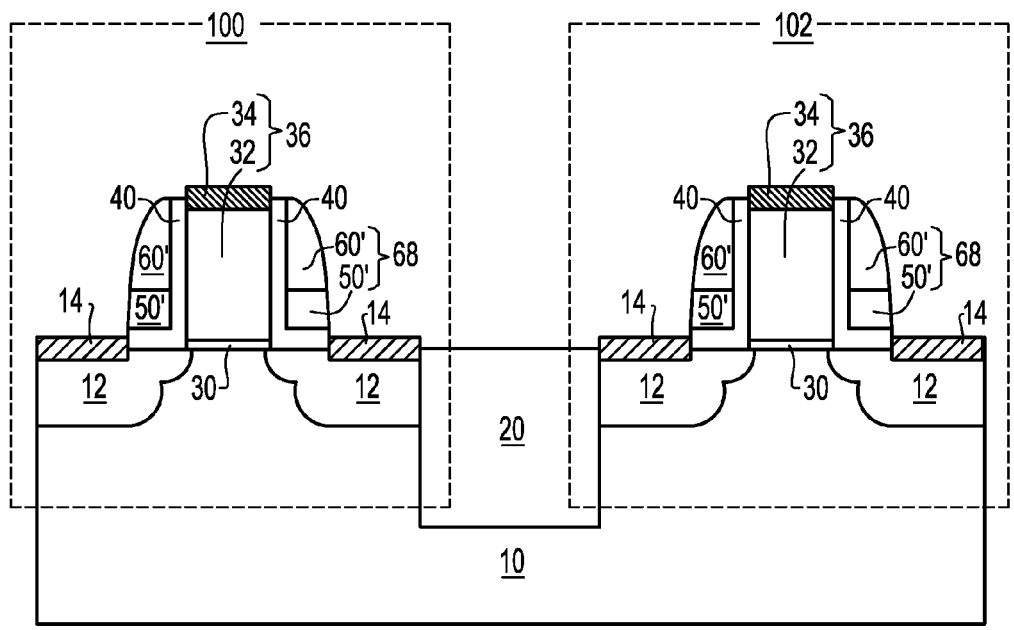

Referring to FIG. 6, both the substrate contacting lower spacer layer 50A and the gate-top-contacting lower spacer layer 50B are etched by a second anisotropic etch, which is preferably a second reactive ion etch (RIE). The gate-top-contacting lower spacer layer 50B is etched during the second anisotropic etch. Also, the portions of the substrate-contacting lower spacer layer 50A outside the upper gate spacer 60' as seen from above are also etched during the second anisotropic etch. The portions of the substrate-contacting lower spacer layer 50A shaded by the upper gate spacers 60' are protected from the second anisotropic etch. A lower gate spacer 50' is formed from each of the remaining portions of the substrate-contacting lower spacer layer 50A. If the upper gate spacer 60' is topologically homeomorphic to a torus, the lower gate spacer 50' directly underneath is also topologically homeomorphic to a torus. Both the source and drain metal semiconductor alloys 14 and the gate metal semiconductor alloys 34 are exposed by the second anisotropic etch. The second anisotropic etch is preferably selective to the source and drain metal semiconductor alloys 14 and the gate metal semiconductor alloys 34.

Figure 7:
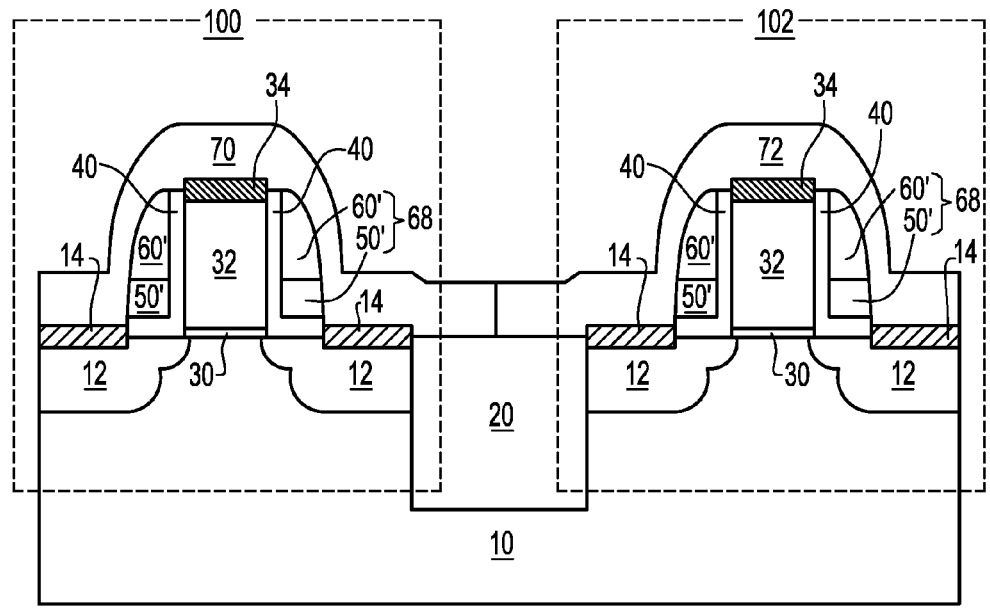

Referring to FIG. 7, a first stress liner 70 is formed on the gate metal semiconductor alloy 34, the upper gate spacer 60', the lower gate spacer 50', and the source and drain metal semiconductor alloy 14 of the PFET 100. In embodiments wherein hole mobility is increased by a uniaxial compressive stress along the channel, as with a silicon substrate, the first stress liner preferably applies a compressive stress to the gate spacers (60', 50', 40) and to the channel of the PFET 100. Similarly, second stress liner 72 is formed on the gate metal semiconductor alloy 34, the upper gate spacer 60', the lower gate spacer 50', and the source and drain metal semiconductor alloy 14 of the NFET 102. In embodiments wherein electron mobility is increased by a uniaxial tensile stress along the channel, as with a silicon substrate, the second stress liner preferably applies a tensile stress to the gate spacers (60', 50', 40) and to the channel of the NFET 102.

The first and second stress liners (70, 72) comprise a dielectric material. Preferably, the first and second stress liners comprise a silicon nitride, such as a plasma enhanced chemical vapor deposition (PECVD) nitride or a high density plasma chemical vapor deposition (HDPCVD) nitride. Preferably, the first stress liner 70 and the second stress liner 72 are formed by different deposition processes in combination with lithographic patterning and etching processes. Alternatively, both the first and second stress liners (70, 72) may be originally formed during the same processing steps, and stress altering processes, such as relaxation of stress by ion implantation, may be performed in combination with lithographic patterning to alter the stress level of one of the two stress liners (70 or 72). Depending on the details of processing steps, the boundary between the first stress liner 70 and the second stress liner 72 may be overlapped, underlapped, or substantially coincident.

Figure 7A:
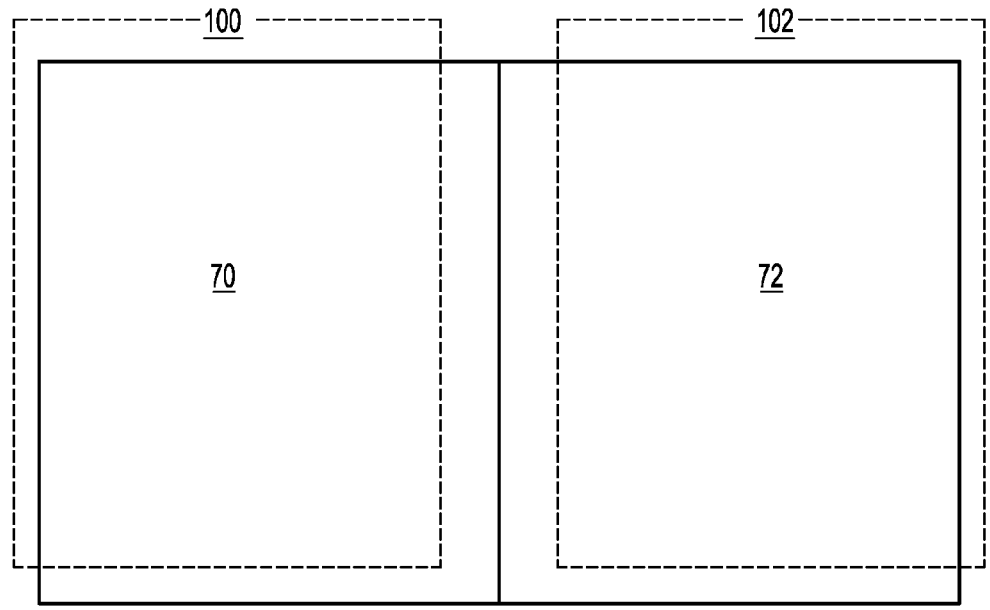
FIG. 7A is a top-down view of the exemplary semiconductor structure in FIG. 7.

Referring to FIG. 7A, a top down view of the first exemplary semiconductor structure in FIG. 7 shows that there is no discontinuity within the first stress liner 70 and within the second stress liner 72. The continuous first stress liner 70 encapsulates the other semiconductor components of the PFET 100 underneath. Similarly, the continuous second stress liner 72 encapsulates the other semiconductor components of the NFET 102 underneath.

Figure 8:
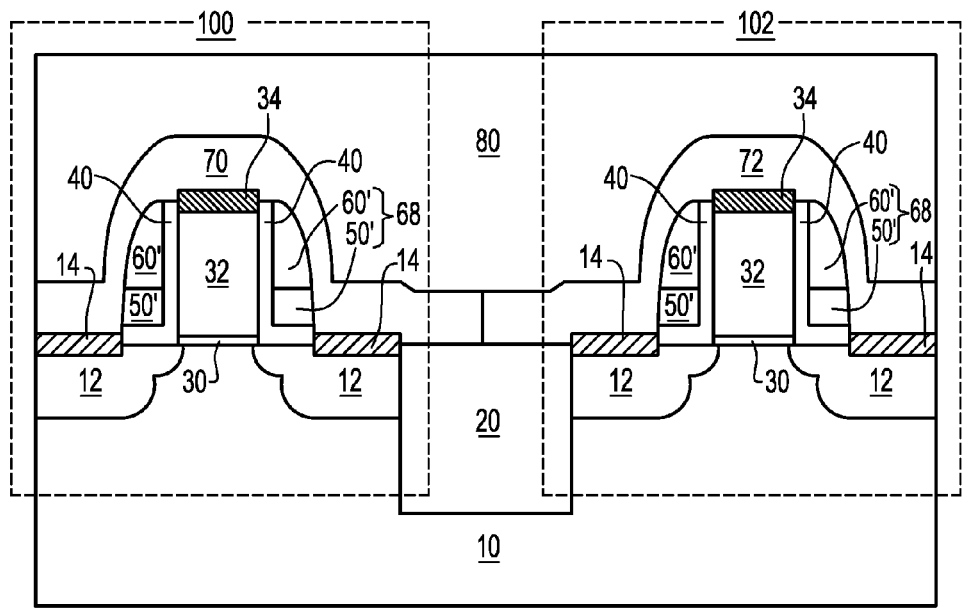

Referring to FIG. 8, a middle-of-line (MOL) dielectric 80 is thereafter deposited and planarized. The MOL dielectric may comprise undoped silicate glass (USG), fluorosilicate glass (FSG), borophosphosilicate glass (BPSG), phosphosilicate glass (PSG), a low-k CVD material such as organosilicate glass (OSG), or polyarylene (SiLK®). Contact vias (not shown) and metal wiring (not shown) are subsequently formed to electrically connect semiconductor components on the substrate 10.

Each of the PFET 100 and the NFET 102 shown in the first exemplary semiconductor structure in FIG. 8 comprises:

a gate electrode 36 contacting a gate dielectric 30 on a semiconductor substrate 30;

a channel (the portion of the semiconductor substrate 10 directly underneath the gate electrode 30; location of the channel is well known in the art) located directly beneath the gate dielectric 30 and located in the semiconductor substrate 10;

an inner gate spacer, which is the L-shaped inner gate spacer 40, directly contacting the gate electrode 36;

a lower gate spacer 50' having a first Young's modulus and contacting the inner gate spacer 40;

an upper gate spacer 60' having a second Young's modulus and contacting the inner gate spacer 40 and a top surface of the lower gate spacer 50', wherein the first Young's modulus is greater than the second Young's modulus; and a stress liner (70 or 72) directly contacting the lower gate spacer 50', wherein the stress liner (70 or 72) applies stress to the lower gate spacer 50' and to the channel.

Due to the higher first Young's modulus of the lower gate spacer 50' compared to the second Young's modulus of the upper gate spacer 60', the upper gate spacer 60' deforms more than the lower gate spacer 50' under the same level of stress applied by the first or second stress liner (70, 72). While the first or second stress liners (70, 72) may not apply the same stress to the upper and lower gate spacers (60', 50'), the net effect of the inventive spacer structure with different Young's moduli between the lower gate spacer 50' and the upper gate spacer 60' is to reduce the transmission of stress through the upper gate spacer 60', while increasing the transmission of stress through the lower gate spacer 50'. Therefore, the stack of the more elastic upper gate spacer 60' and a stiffer lower gate spacer 50' concentrates the stress generated by the first or second stress liner (70, 72) toward the lower portion of the stack, and consequently, on the channel directly beneath the gate dielectric 30. For this reason, the inventive spacer structure is a stress-concentrating spacer structure, which increases the stress transmitted to the channel compared to conventional spacer structures that have a uniform Young's modulus in the spacer.

Further, the stress liner (70 or 72) directly contacts the upper gate spacer 60' and a top surface of the gate electrode 36. The stress liner (70 or 72) is of unitary construction, i.e., in one piece, within the PFET 100 or within the NFET 102.

Figure 9:
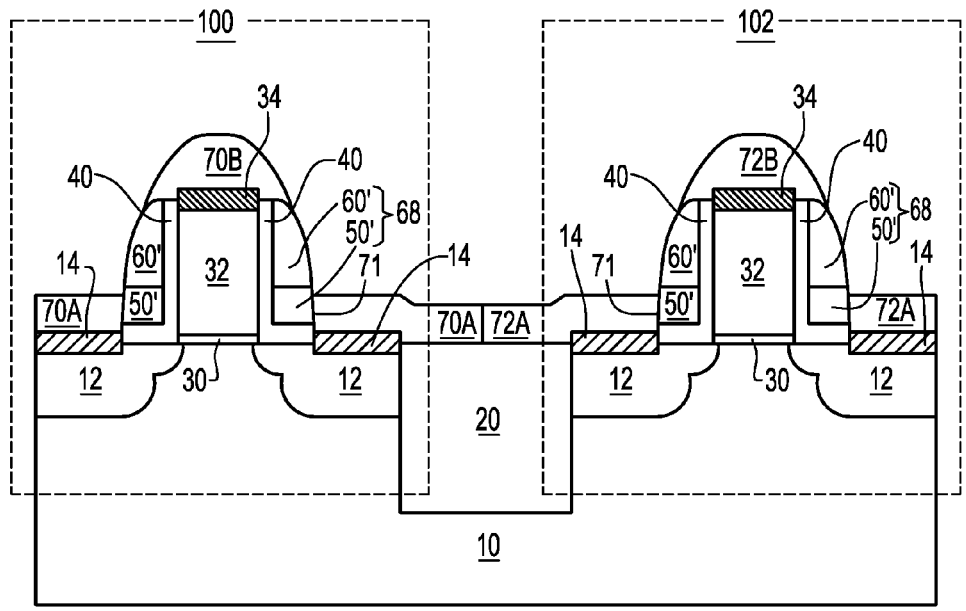
FIGS. 9-10 are sequential vertical cross-sectional views of the second exemplary semiconductor structure according to a second embodiment of the present invention.

Referring to FIG. 9, a second exemplary semiconductor structure according to a second embodiment of the present invention is shown. According to the second embodiment, the first stress liner 70 and the second stress liner 72 in the semiconductor structure in FIG. 7 according to the first embodiment are subjected to an etch, which is preferably an isotropic etch. The isotropic etch may be a wet etch or a reactive ion etch. The first stress liner 70 and the second stress liner 72 may be etched at the same time or sequentially with lithographic masking of one of the two stress liners (70, 72). The etch removes the thin portion of the first and second stress liners (70, 72) from above the upper gate spacers 60'. Each of the stress liners (70, 72) contains a hole with a periphery 71, wherein the stress nitride liner (70 or 72) is located outside the periphery 71 and terminates on the periphery 71, and the periphery 71 of the hole is substantially coincident with an outer edge of the lower gate spacer 50'. A gate cap liner 70B, which is formed out of the remaining portion of one of the two stress liners (70 or 72) on top of the gate electrode 36, is located directly on top of the gate electrode 36. The gate cap liner 70B does not contact the lower gate spacer 50' and is disjoined from the remaining stress liner 70A.

Since the gate cap liner 70B does not surround the gate electrode 36, the gate cap liner 70B is ineffective in generating a uniaxial stress along the direction of the channel, i.e., the direction connecting the source and the drain. Since the gate cap liner 70B is disjoined from the stress liners (70A, 72A), the local structure of each stress liner (70A or 72A) according to the second embodiment around the gate electrode 36 is topologically homeomorphic to a torus, which is in contrast to the stress liners (70, 72) without a hole according to the first embodiment. Due to the presence of the hole around the gate electrode 36, the stress liner (70A or 72A) is not constrained by any portion of a stress liner (70A or 72A) over the gate electrode 36 from pushing or pulling on the gate electrode 36, thereby increasing the stress on the gate spacers (40, 50', 60') and on the channel. Further, since the first or second stress liner (70A or 72A), while contacting the lower gate spacer 50', does not contact the upper gate spacer 60' or contacts only a lower portion of the upper gate spacer 60', the transmission of the stress generated by the first or second stress liner (70A or 72A) is concentrated to the bottom of the gate electrode 36 and to the channel.

Figure 9A:
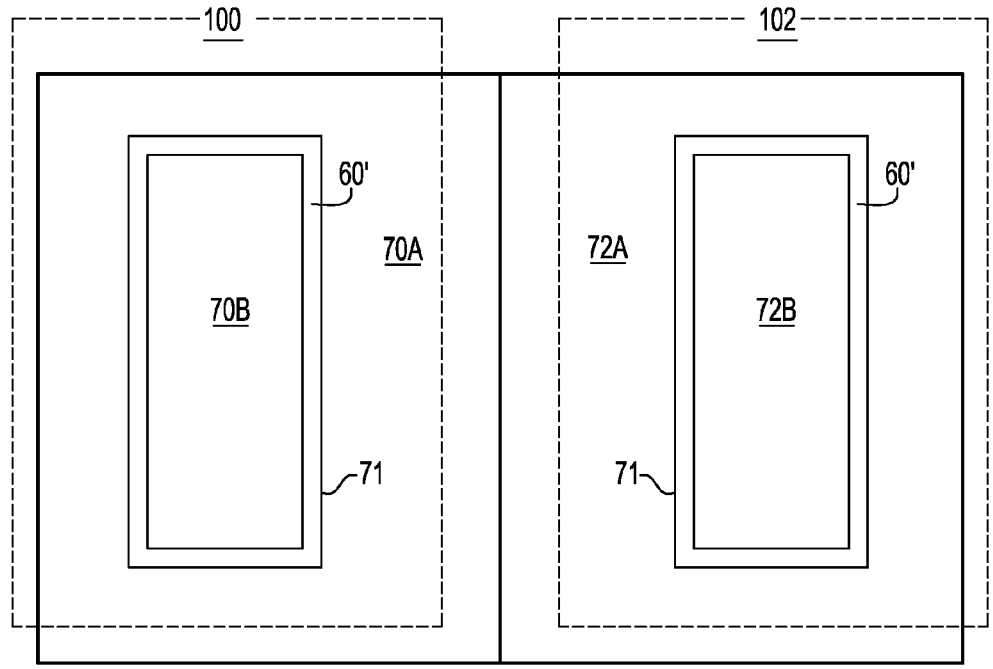
FIG. 9A is a top-down view of the exemplary semiconductor structure in FIG. 9.

Referring to FIG. 9A, a top down view of the second exemplary semiconductor structure in FIG. 9 shows the topology of the first stress liner 70 and the second stress liner 72. Both of the two stress liners (70, 72) have a hole with a periphery 71. Due to the hole, each of the two stress liners is topologically homeomorphic to a torus. The gate cap liners 70B are disjoined from the two stress liners (70, 72).

Figure 10:
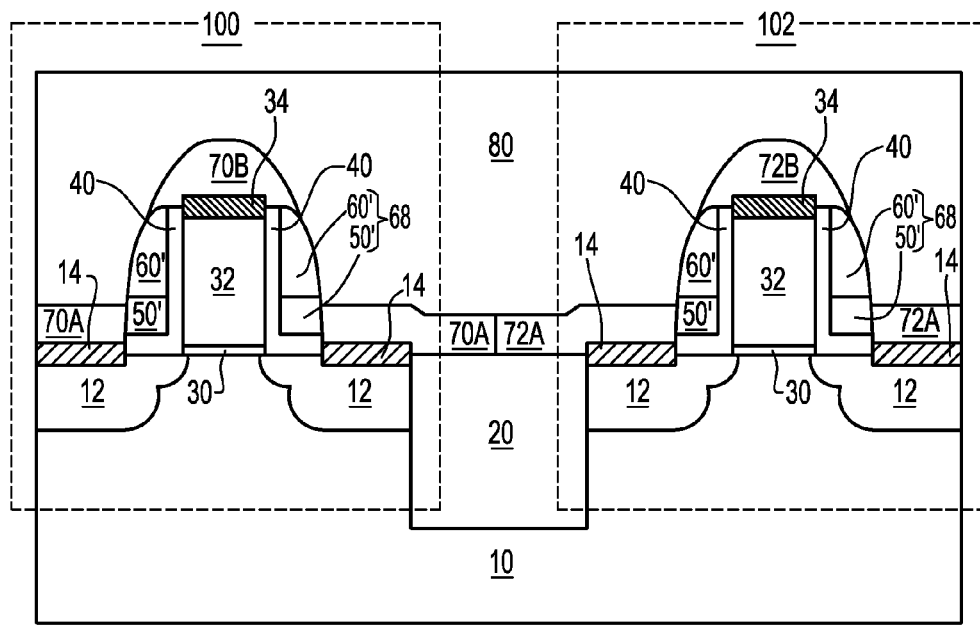

Referring to FIG. 10, a middle-of-line (MOL) dielectric 80 is thereafter deposited and planarized. The MOL dielectric 80 according to the second embodiment may comprise the same MOL dielectric material according to the first embodiment as described above.

Each of the PFET 100 and the NFET 102 shown in the second exemplary semiconductor structure in FIG. 10 comprises similar components as those in FIG. 8 according to the first embodiment. The difference is that the stress liner (70A or 72A) contains a hole with a periphery 71, wherein the stress nitride liner (70A or 72A) is located outside the periphery 71 and terminates on the periphery 71, and the periphery 71 of the hole is substantially coincident with an outer edge of the lower gate spacer 50'. A gate cap liner 70B is located directly on top of the gate electrode 36. The gate cap liner 70B does not contact the lower gate spacer 50' and is disjoined from the stress liner (70A or 70B).

Figure 11:
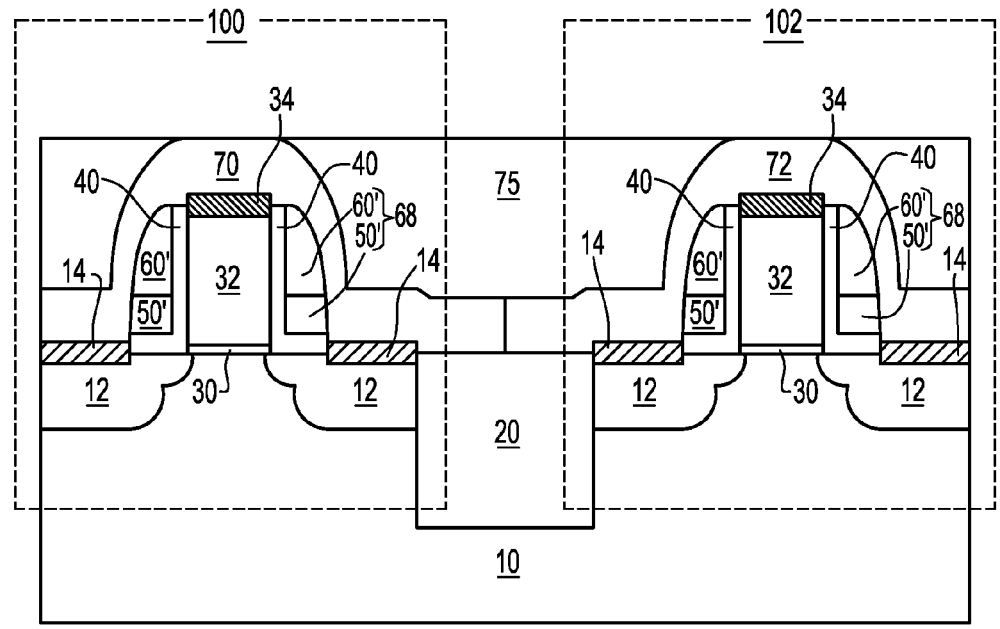
FIGS. 11-15 are sequential vertical cross-sectional views of the third exemplary semiconductor structure according to a third embodiment of the present invention.

Referring to FIG. 11, a third exemplary semiconductor structure according to a third embodiment of the present invention is shown. According to the third embodiment of the present invention, a planarizing layer 75 is deposited on the semiconductor structure shown in FIG. 7 according to the first embodiment of the present invention. The planarizing layer 75 may be a semiconductor layer, such as silicon, germanium, silicon germanium alloy, or a dielectric layer such as undoped silicate glass (USG), fluorosilicate glass (FSG), borophosphosilicate glass (BPSG), or phosphosilicate glass (PSG). During the deposition of the planarizing layer 75, the topography caused by the variations in the height of the underlying structures, such as the gate electrodes 36, is transferred to the top surface of the planarizing layer 75. Typically, chemical mechanical planarization (CMP) is performed on the planarizing layer 75 to eliminate or reduce the topography and to form a flat top surface. The underlying first and second stress liners (70, 72) may be employed as a stopping layer for the CMP process to produce a structure shown in FIG. 11. At the end of the CMP process, top surfaces of the portions of the first and second stress liners (70, 72) over the gate electrodes 36 are exposed.

Figure 12:
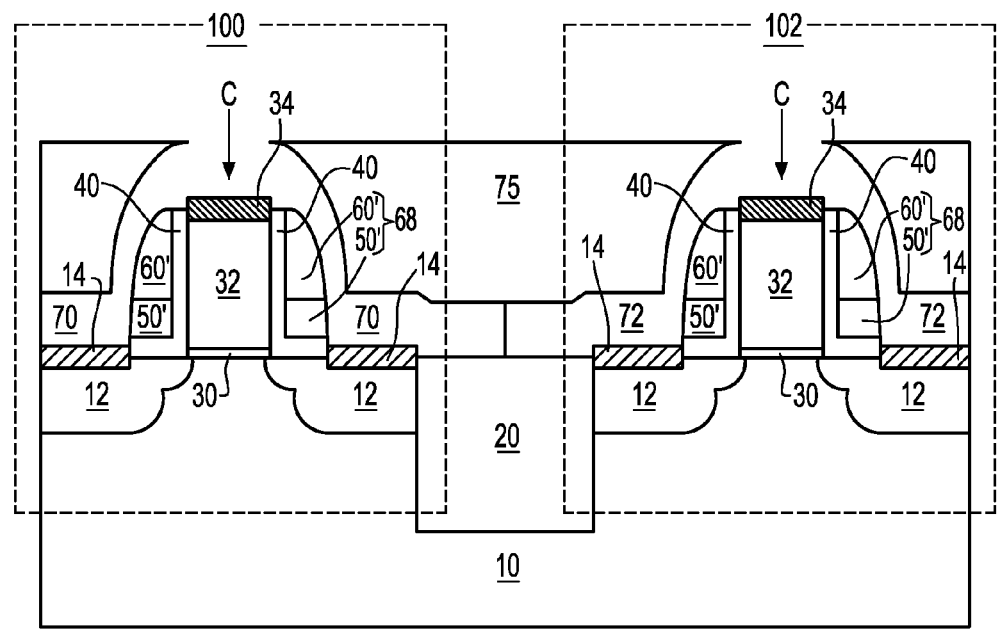

The exposed top surfaces of the first and second stress liners (70, 72) are subjected to a second etch to remove the portion of the first and second stress liners (70, 72) over the gate electrodes 36. The second etch is preferably an isotropic etch, and may be a wet etch or a reactive ion etch. A cavity C is formed over each of the gate electrode 36 as shown in FIG. 12.

Figure 13:
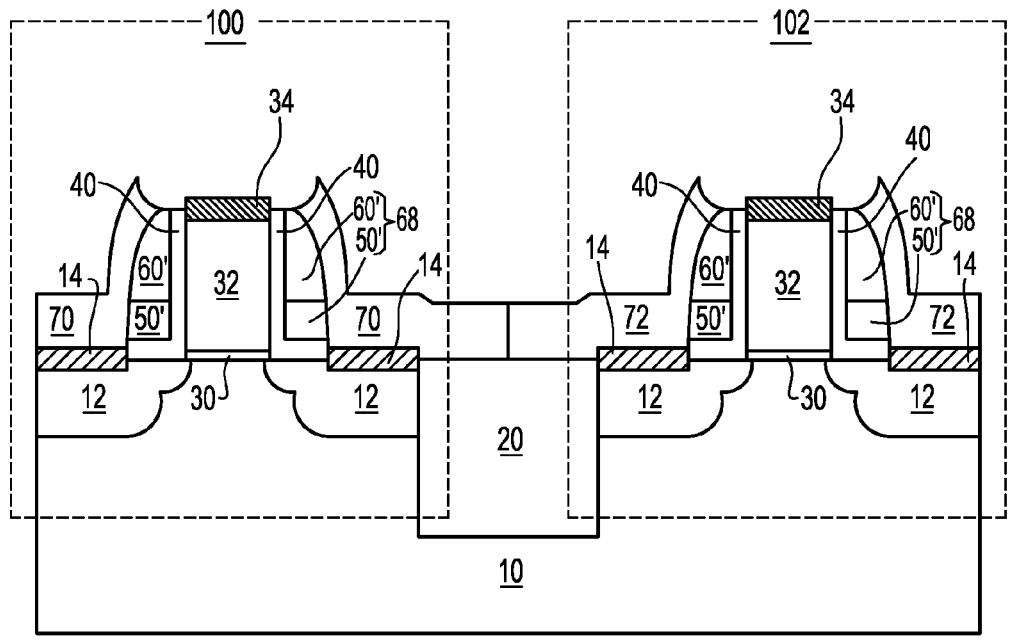

Referring to FIG. 13, the planarizing layer 75 is removed by a third etch. The third etch may be a wet etch or a reactive ion etch. The third etch is selective to the first and second stress liners (70, 72). All of the planarizing layer 75 may be removed as shown in FIG. 13. Alternatively, a thin layer (not shown) of the planarizing layer 75 may be left above the horizontal portions of the first and second stress liners (70, 72) to protect these portions from a fourth etch to be subsequently performed.

Figure 14:
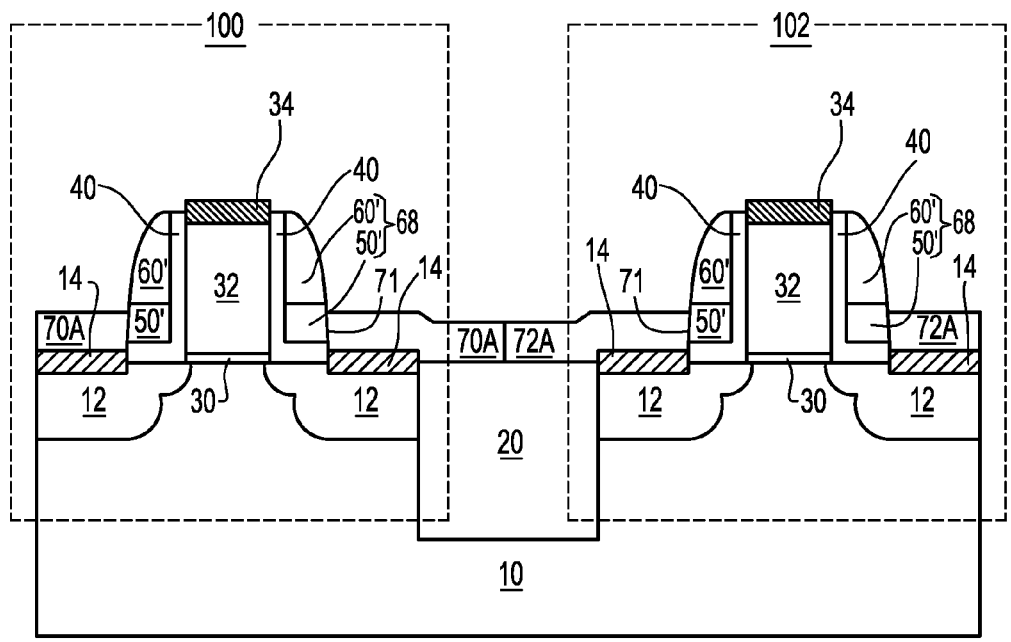

The first and second stress liners (70, 72) are subjected to a fourth etch to remove the portions of the first and second stress liners (70, 72) located above the upper gate spacer 60'. The fourth etch is preferably an isotropic etch. The fourth etch may be a wet etch or a reactive ion etch. If all of the planarizing layer 75 is removed during the third etch, horizontal portions of the first and second stress liners (70, 72) are partially etched during the fourth etch, and a thinner first and second stress liners (70A, 72A) are formed by the fourth etch as shown in FIG. 14. Alternatively, if some material (not shown) of the planarizing layer 75 is left on the horizontal portions of the first and second stress liners (70, 72) during the third etch, the loss of material from the first and second stress liners (70, 72) may be reduced during the fourth etch.

Figure 14A:
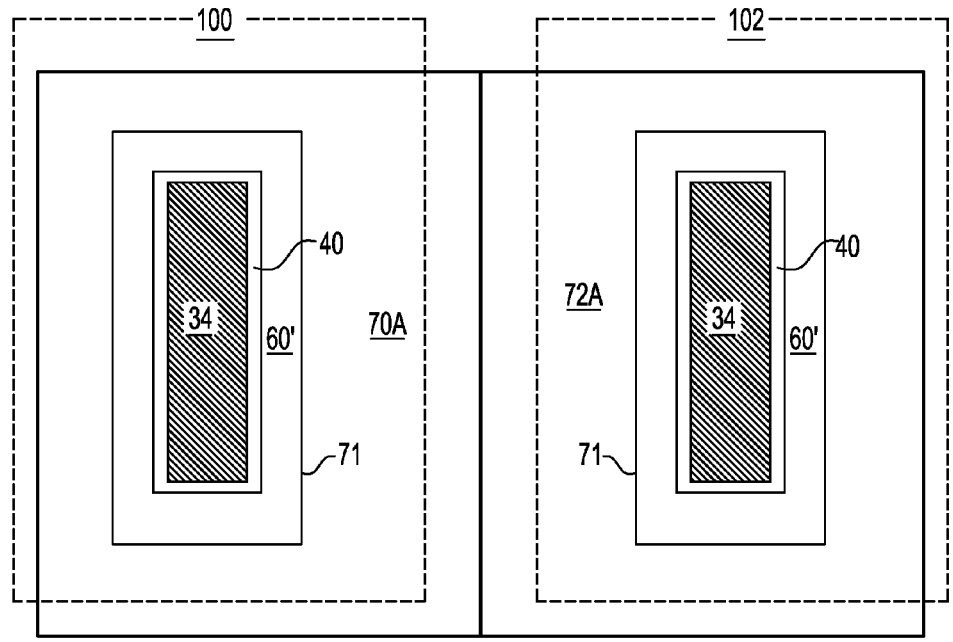
FIG. 14A is a top-down view of the exemplary semiconductor structure in FIG. 14.

Referring to FIG. 14A, a top down view of the third exemplary semiconductor structure shows the topology of the first stress liner 70A and the second stress liner 72A. Both of the two stress liners (70A, 72A) have a hole with a periphery 71. Due to the hole, each of the two stress liners (70A, 72A) is topologically homeomorphic to a torus. The upper gate spacer 60' and the gate metal semiconductor alloy 34 are exposed after the fifth etch.

Figure 15:
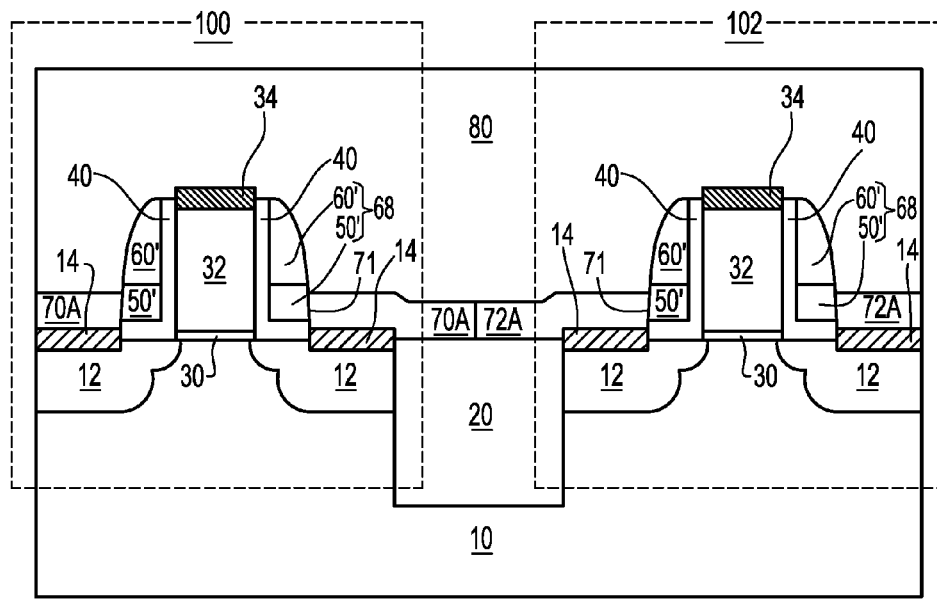

Referring to FIG. 15, a middle-of-line (MOL) dielectric 80 is thereafter deposited and planarized. The MOL dielectric 80 according to the third embodiment may comprise the same MOL dielectric material according to the first embodiment as described above.

Each of the PFET 100 and the NFET 102 shown in the third exemplary semiconductor structure in FIG. 15 comprises similar components as those in FIG. 8 according to the second embodiment. The difference is that the gate cap liner 70B of the second embodiment is not present in the third embodiment.

Figure 16:
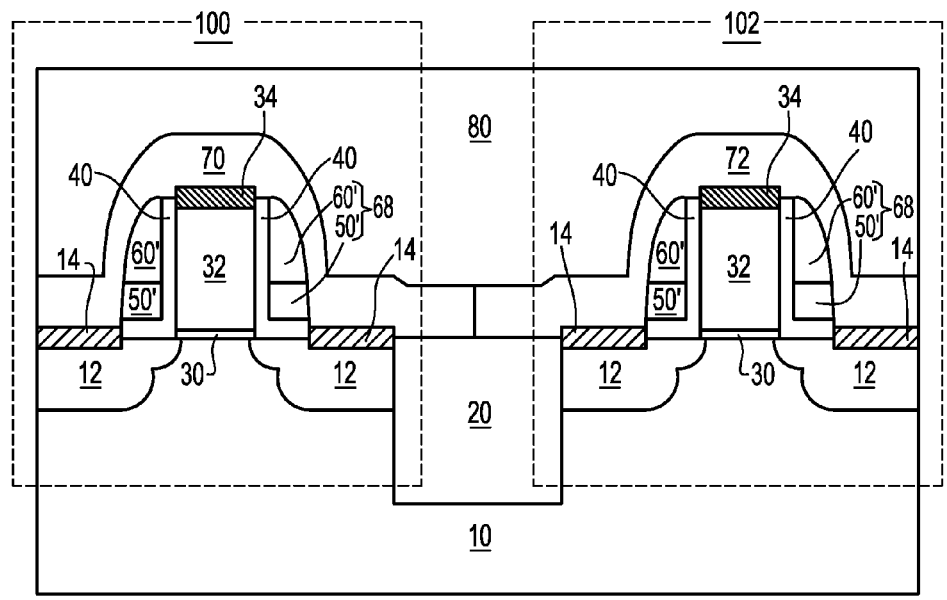
FIGS. 16-21 are vertical cross-sectional views of the exemplary semiconductor structure according to a fourth through ninth embodiment of the present invention, respectively.

Referring to FIG. 16, a fourth exemplary structure according to a fourth embodiment of the present invention is shown. According to the fourth embodiment, the inner gate spacer 40 is not L-shaped, but is formed only on the sidewalls of the gate electrode 36. Therefore, the lower spacer layer (not shown in FIG. 16, refer to FIG. 2) directly contacts the source and drain regions 12. After the formation of the lower gate spacer 50', the lower gate spacer 50' directly contacts the source and drain regions 12. Other than the formation of different inner gate spacers 40, the same processing steps are employed in the fourth embodiment as in the first embodiment. Other than the direct contact between the lower gate spacer 50' and the source and drain regions 12, the fourth exemplary structure has the same structural characteristics as the first exemplary structure in FIG. 8.

Figure 17:
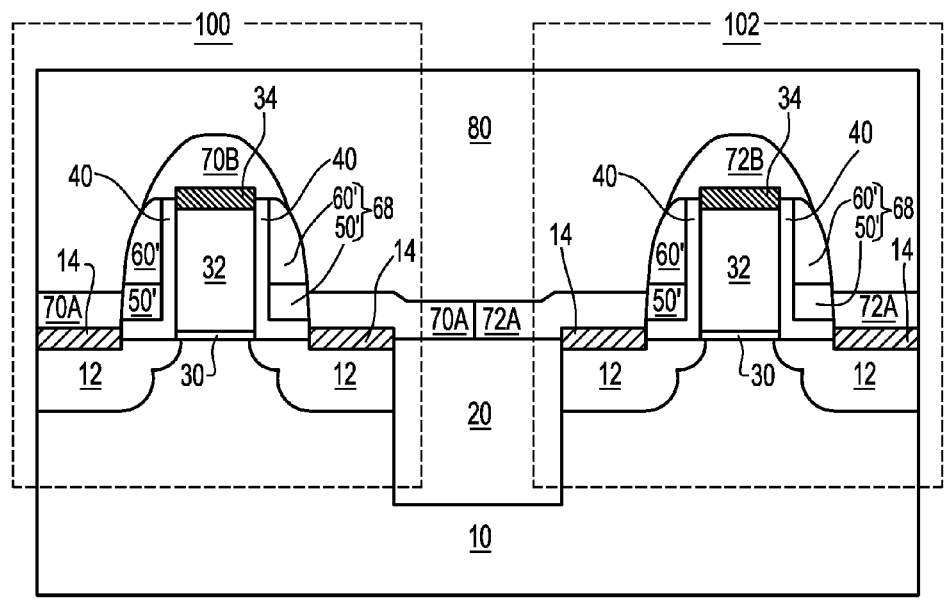

Referring to FIG. 17, a fifth exemplary structure according to a fifth embodiment of the present invention is shown. According to the fifth embodiment, the inner gate spacer 40 is not L-shaped, but is formed only on the sidewalls of the gate electrode 36 as in the fourth embodiment. Therefore, the lower spacer layer (not shown in FIG. 17, refer to FIG. 2) directly contacts the source and drain regions 12. After the formation of the lower gate spacer 50', the lower gate spacer 50' directly contacts the source and drain regions 12. Other than the formation of different inner gate spacers 40, the same processing steps are employed in the fifth embodiment as in the second embodiment. Other than the direct contact between the lower gate spacer 50' and the source and drain regions 12, the fifth exemplary structure has the same structural characteristics as the second exemplary structure in FIG. 10.

Figure 18:
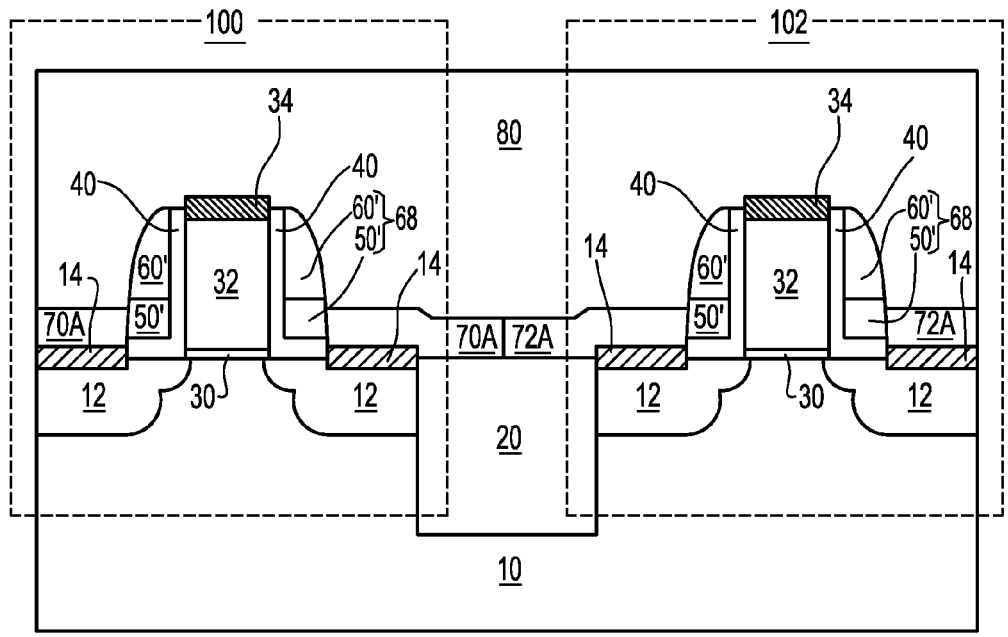

Referring to FIG. 18, a sixth exemplary structure according to a sixth embodiment of the present invention is shown. According to the sixth embodiment, the inner gate spacer 40 is not L-shaped, but is formed only on the sidewalls of the gate electrode 36 as in the fourth embodiment. Therefore, the lower spacer layer (not shown in FIG. 18, refer to FIG. 2) directly contacts the source and drain regions 12. After the formation of the lower gate spacer 50', the lower gate spacer 50' directly contacts the source and drain regions 12. Other than the formation of different inner gate spacers 40, the same processing steps are employed in the sixth embodiment as in the third embodiment. Other than the direct contact between the lower gate spacer 50' and the source and drain regions 12, the sixth exemplary structure has the same structural characteristics as the third exemplary structure in FIG. 15.

Figure 19:
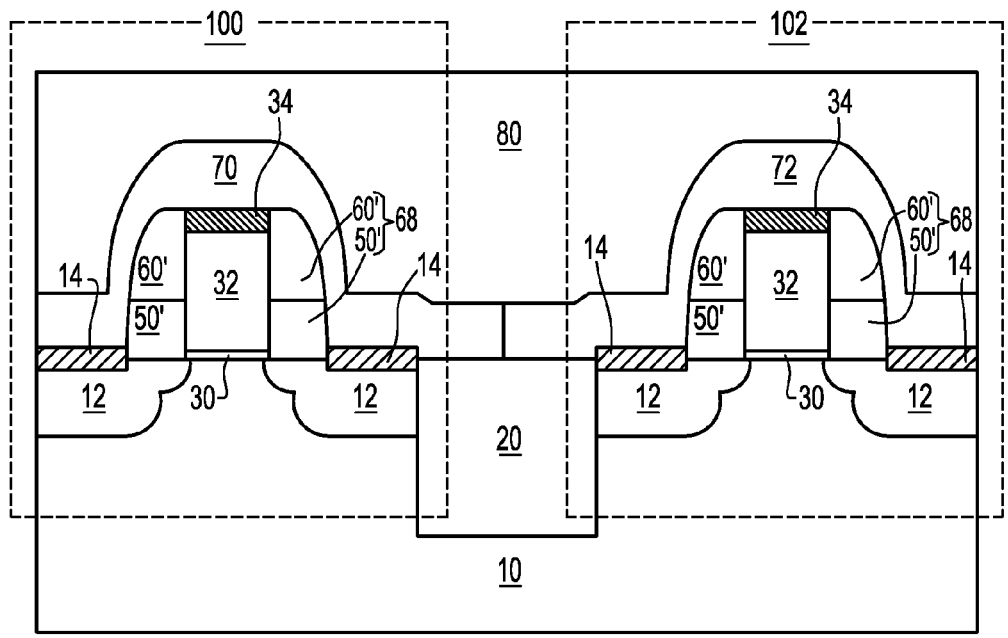

Referring to FIG. 19, a seventh exemplary structure according to a seventh embodiment of the present invention is shown. According to the seventh embodiment, an inner gate spacer is not present in the structure. Therefore, both the lower gate spacer 60' and the upper gate spacer 50' directly contact the sidewalls of the gate electrode 36. Also, the lower spacer layer (not shown in FIG. 19, refer to FIG. 2) directly contacts the source and drain regions 12. Other than omission of the formation of an inner gate spacer, the same processing steps are employed in the seventh embodiment as in the first embodiment. The seventh exemplary structure has the same structural characteristics as the first exemplary structure in FIG. 8 with the exceptions of the direct contact between the lower gate spacer 50' and the source and drain regions 12, the direct contact between the lower gate spacer 50' and the sidewalls of the gate electrode 36, and the direct contact between the upper gate spacer 60' and the sidewalls of the gate electrode 36 according to the seventh embodiment.

Figure 20:
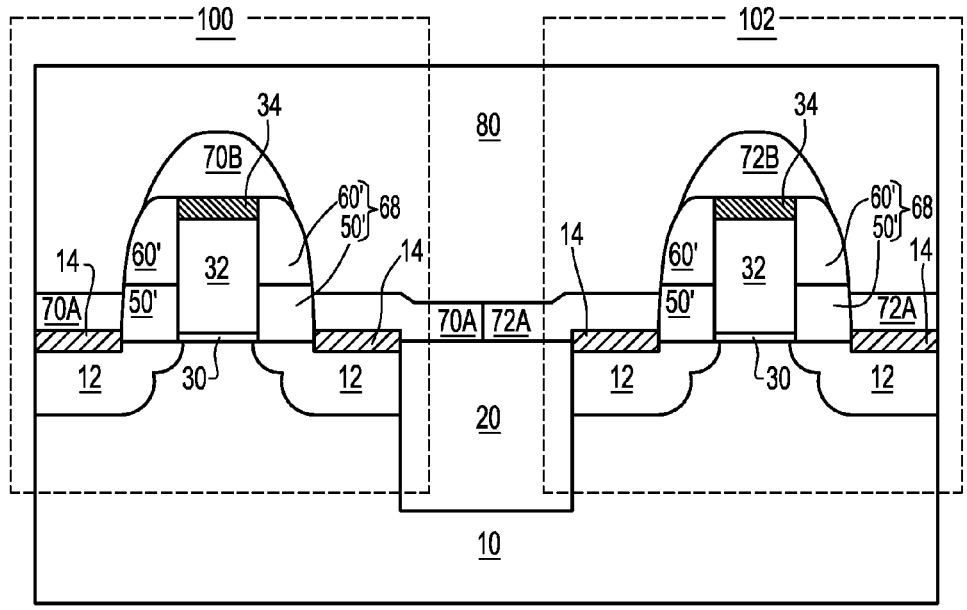

Referring to FIG. 20, an eighth exemplary structure according to an eighth embodiment of the present invention is shown. According to the eighth embodiment, an inner gate spacer is not present in the structure. Therefore, both the lower gate spacer 60' and the upper gate spacer 50' directly contact the sidewalls of the gate electrode 36 as in the seventh embodiment. Also, the lower spacer layer (not shown in FIG. 19, refer to FIG. 2) directly contacts the source and drain regions 12. Other than omission of the formation of an inner gate spacer, the same processing steps are employed in the eighth embodiment as in the second embodiment. The eighth exemplary structure has the same structural characteristics as the second exemplary structure in FIG. 10 with the exceptions of the direct contact between the lower gate spacer 50' and the source and drain regions 12, the direct contact between the lower gate spacer 50' and the sidewalls of the gate electrode 36, and the direct contact between the upper gate spacer 60' and the sidewalls of the gate electrode 36 according to the eighth embodiment.

Figure 21:
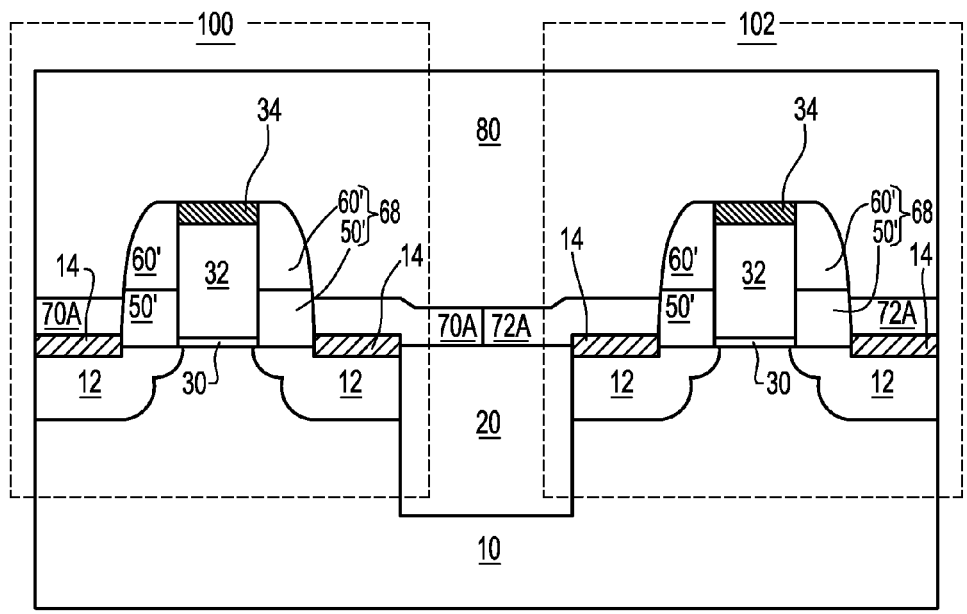

Referring to FIG. 21, a ninth exemplary structure according to a ninth embodiment of the present invention is shown. According to the ninth embodiment, an inner gate spacer is not present in the structure. Therefore, both the lower gate spacer 60' and the upper gate spacer 50' directly contact the sidewalls of the gate electrode 36 as in the seventh embodiment. Also, the lower spacer layer (not shown in FIG. 19, refer to FIG. 2) directly contacts the source and drain regions 12. Other than omission of the formation of an inner gate spacer, the same processing steps are employed in the ninth embodiment as in the third embodiment. The ninth exemplary structure has the same structural characteristics as the third exemplary structure in FIG. 10 with the exceptions of the direct contact between the lower gate spacer 50' and the source and drain regions 12, the direct contact between the lower gate spacer 50' and the sidewalls of the gate electrode 36, and the direct contact between the upper gate spacer 60' and the sidewalls of the gate electrode 36 according to the ninth embodiment.

Figure 21A:
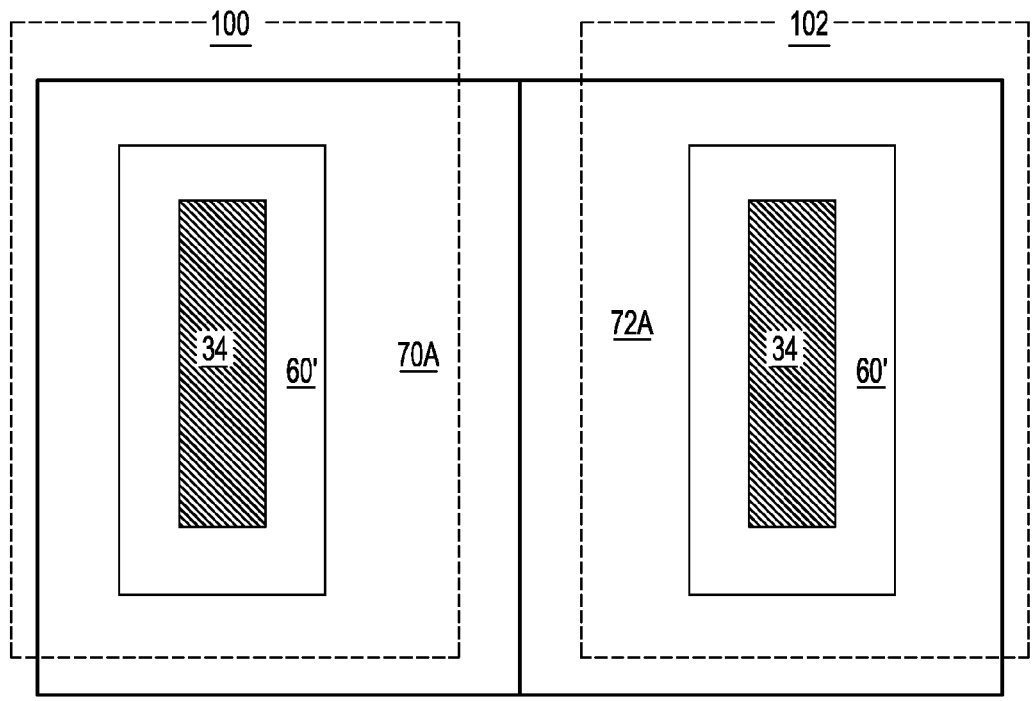
FIG. 21A is a top-down view of the exemplary semiconductor structure in FIG. 21.

Referring to FIG. 21A, a top down view of the ninth exemplary semiconductor structure shows the topology of the first stress liner 70A and the second stress liner 72A. Both of the two stress liners (70A, 72A) have a hole with a periphery 71 as in the third embodiment. Due to the hole, each of the two stress liners (70A, 72A) is topologically homeomorphic to a torus. The upper gate spacer 60' and the gate metal semiconductor alloy 34 are exposed after the fifth etch. These features are similar to the features in FIG. 14A according to the third embodiment. Unlike the third embodiment, however, an inner gate spacer is not present.

Figure 22:
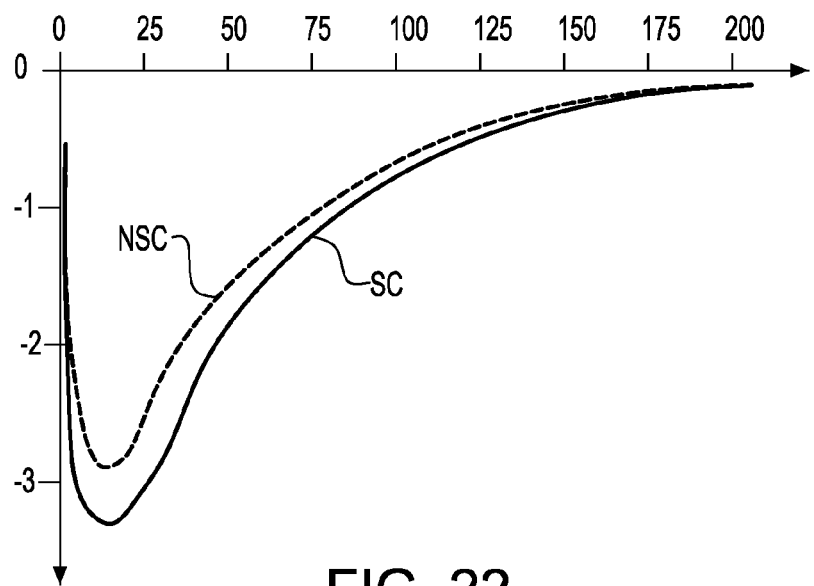
FIG. 22 is a simulation result comparing the stress on the channel of an exemplary MOSFET according to the present invention with the stress on the channel of a conventional MOSFET.

FIG. 22 shows a simulation result comparing the simulated stress SC on the channel of an inventive MOSFET structure to the simulated stress NSC on the channel of a conventional MOSFET structure. The inventive MOSFET structure employs a stress concentrator structure described above. The stress applied by a stress liner (70, 70A, 72, or 72A) are assumed to be the same for both MOSFET structures in the simulation. The use of a stress concentrator structure according to the present invention results in an increase in the magnitude of the simulated stress on the order of about 10%.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a semiconductor structure, comprising:

forming a gate electrode on a gate dielectric on a semiconductor substrate;

forming a source and drain metal semiconductor alloy on said semiconductor substrate;

forming an L-shaped inner gate spacer that abuts sidewalls of said gate electrode and abuts source and drain regions;

forming a non-conformal lower spacer layer with a first Young's modulus on said gate electrode and said semiconductor substrate, wherein said first Young's modulus is in a range from about 100 GPa to about 1,000 GPa;

removing a vertical portion of said non-conformal lower spacer layer on said gate electrode and exposing underlying vertical surfaces, whereby a substrate-contacting lower spacer layer is formed directly on said source and drain metal semiconductor alloy and a gate-top-contacting lower spacer layer is formed directly on said gate electrode from remaining portions of said non-conformal lower spacer layer, wherein said exposed underlying vertical surfaces are sidewalls of said L-shaped inner gate spacer;

forming an upper gate spacer with a second Young's modulus directly on said exposed underlying vertical surfaces and on said substrate-contacting lower spacer layer, wherein said first Young's modulus is greater than said second Young's modulus, and wherein said second Young's modulus is in a range from 0 GPa to about 100 GPa;

removing said gate-top-contacting lower spacer layer and a portion of said substrate-contacting lower spacer layer that is not covered by said upper gate spacer to form a lower gate spacer directly beneath said upper gate spacer and directly on said L-shaped inner gate spacer, wherein said lower gate spacer does not abut said source and drain region;

forming a stress liner directly on said lower gate spacer and said upper gate spacer;

removing a portion of said stress liner from above the sidewalls of said upper gate spacer;

forming a middle-of-line (MOL) dielectric layer on a remaining portion of said stress liner, wherein said remaining portion is located directly on a source and drain metal semiconductor alloy and said MOL dielectric layer directly contacts said upper gate spacer, and wherein said MOL dielectric layer does not abut said lower gate spacer, said upper gate spacer, or said gate electrode; and removing said stress liner from above said gate electrode, wherein said MOL dielectric layer abuts a top surface of said gate electrode.

* * * * *